United States Patent
Mizuguchi

(10) Patent No.: US 11,152,912 B2
(45) Date of Patent: Oct. 19, 2021

(54) PIEZOELECTRIC RESONATOR UNIT

(71) Applicant: Murata Manufacturing Co., Ltd., Nagaokakyo (JP)

(72) Inventor: Takashi Mizuguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 685 days.

(21) Appl. No.: 16/056,970

(22) Filed: Aug. 7, 2018

(65) Prior Publication Data

US 2019/0074816 A1 Mar. 7, 2019

(30) Foreign Application Priority Data

Sep. 1, 2017 (JP) .............. JP2017-168140

(51) Int. Cl.
| | |
|---|---|
| *H03H 9/10* | (2006.01) |
| *H03H 3/02* | (2006.01) |
| *H03H 9/05* | (2006.01) |
| *H03H 9/19* | (2006.01) |
| *H03H 9/02* | (2006.01) |

(52) U.S. Cl.
CPC .......... *H03H 9/1021* (2013.01); *H03H 3/02* (2013.01); *H03H 9/02023* (2013.01); *H03H 9/0509* (2013.01); *H03H 9/19* (2013.01); *H03H 2003/022* (2013.01)

(58) Field of Classification Search
CPC ...... H03H 9/1021; H03H 9/0509; H03H 9/19; H03H 9/02023; H03H 3/02
USPC .................................................. 331/66, 158
See application file for complete search history.

(56) References Cited

U.S. PATENT DOCUMENTS

| | | | |
|---|---|---|---|
| 9,549,481 B2 | 1/2017 | Kamakura | |
| 2011/0193644 A1 | 8/2011 | Tange | |
| 2014/0003004 A1 | 1/2014 | Kamakura | |
| 2014/0320225 A1* | 10/2014 | Harima | ............... H03H 9/0519 |
| | | | 331/158 |

(Continued)

FOREIGN PATENT DOCUMENTS

| | | |
|---|---|---|
| JP | 2000100983 A | 4/2000 |
| JP | 2008193581 A | 8/2008 |
| JP | 2011166308 A | 8/2011 |

(Continued)

*Primary Examiner* — Arnold M Kinkead
(74) *Attorney, Agent, or Firm* — Arent Fox LLP

(57) ABSTRACT

A piezoelectric resonator unit comprises a first enclosure portion that includes a first principal surface portion and a substantially curtain-shaped portion which cooperate to define a first recessed portion. The first principal surface portion has a first flat principal surface and the substantially curtain-shaped portion surrounds the first principal surface when viewed from a normal direction to the first principal surface. A second enclosure portion has a flat second principal surface and cooperates with the first recessed portion to define an enclosure which houses a piezoelectric resonator. A brazing material joins a distal end of the first enclosure portion to the second enclosure portion to hermetically seal the enclosure. An inner peripheral surface of the substantially curtain-shaped portion includes a stepped portion that is defined by adjacent thicker and a thinner portions of the substantially curtain-shaped portion. A surface of the stepped portion is formed of a single material.

10 Claims, 7 Drawing Sheets

(56) References Cited

U.S. PATENT DOCUMENTS

2018/0033706 A1    2/2018  Sonoda et al.

FOREIGN PATENT DOCUMENTS

| JP | 2015173405 | A | 10/2015 |
| JP | 2016171143 | A | 9/2016 |
| TW | 201404251 | A | 1/2014 |

* cited by examiner

PIEZOELECTRIC RESONATOR UNIT

CROSS REFERENCE TO RELATED APPLICATIONS

The present application claims priority to Japanese Patent Application No. 2017-168140, filed Sep. 1, 2017, the entire contents of each of which are incorporated herein by reference.

BACKGROUND OF THE INVENTION

Field of the Invention

The present invention relates to a piezoelectric resonator unit.

Description of the Related Art

As an invention that relates to an existing piezoelectric resonator unit, for example, a piezoelectric resonator unit that is described in Japanese Unexamined Patent Application Publication No. 2008-193581 (Patent Document 1) is known. The piezoelectric resonator unit that is described in Patent Document 1 includes a substrate, a piezoelectric resonator, and a cover. One of the surfaces of the substrate has a recessed portion (cavity). The piezoelectric resonator that is substantially plate-shaped is mounted on a bottom surface of the recessed portion by a conductive holding member. The cover is formed of a metal. Such a piezoelectric resonator unit described above is used in, for example, a piezoelectric oscillator.

The cover is mounted on the substrate so as to hermetically seal the recessed portion. The cover is joined to an opening edge portion of the recessed portion of the substrate by a brazing material. Here, there is a problem in that the brazing material spreads out on a surface of the cover. In an effort to mitigate this problem the piezoelectric resonator unit of Patent Document 1 has a groove in the cover. The brazing material that has spread out on the surface of the cover does not easily flow beyond the groove.

A piezoelectric resonator unit that is described in Japanese Unexamined Patent Application Publication No. 2016-171143 (Patent Document 2) includes a substrate, a piezoelectric resonator, and a cap. The cap is a cover having a recessed portion. An opening edge portion of the recessed portion of the cap has a flange. The piezoelectric resonator is mounted on the substrate by a conductive holding member. The flange is fixed to the substrate by a brazing material. This causes the cap to be fixed to the substrate such that the piezoelectric resonator is accommodated in the recessed portion.

In the process of manufacturing this piezoelectric resonator unit, when joining the substrate and the cap to each other, the brazing material may flow out from a location between the substrate and the flange and spread out. Therefore, in the piezoelectric resonator unit that is described in Patent Document 2, a surface of the flange facing the substrate has a groove. The brazing material is held back by the groove at the location between the flange and the substrate. Therefore, the brazing material does not easily protrude and spread out from the location between the flange and the substrate.

An electronic-component-accommodating enclosure such as that disclosed in Japanese Unexamined Patent Application Publication No. 2000-100983 (Patent Document 3) is also known.

According to the inventions in Patent Documents 1 and 2, it is possible to suppress the spreading out of the brazing material. However, there is a demand for a piezoelectric resonator unit that is capable of further suppressing the spreading out of the brazing material.

SUMMARY OF THE INVENTION

Accordingly, it is an object of the present invention to provide a piezoelectric resonator unit that is capable of suppressing the spreading out of brazing material during manufacturing.

According to one aspect of the invention, a piezoelectric resonator unit comprises:

a first enclosure portion that includes a first principal surface portion and a substantially curtain-shaped portion which cooperate to define a first recessed portion, the first principal surface portion having a first flat principal surface, the substantially curtain-shaped portion surrounding the first principal surface when viewed from a normal direction to the first principal surface;

a second enclosure portion that has a flat second principal surface and cooperating with the first recessed portion to define an enclosure;

a brazing material that joins a distal end of the first enclosure portion to the second enclosure portion to hermetically seal the enclosure; and a piezoelectric resonator that is accommodated in the recessed portion;

wherein an inner peripheral surface of the substantially curtain-shaped portion includes a stepped portion including a thicker portion and a thinner portion as measured in a direction parallel to the first principal surface portion, a surface of the stepped portion being formed of a single material.

In one embodiment, a thickness of a region of the substantially curtain-shaped portion that is located adjacent the brazing material is thinner than other regions of the substantially curtain-shaped portion.

In an embodiment, the thinner portion is located at the distal end of the substantially curtain-shaped portion.

In another embodiment the thinner portion is located at a position that is remote from the distal end of the substantially curtain-shaped portion.

In another embodiment the thicker portion is located adjacent the distal end of the substantially curtain-shaped portion.

In a preferred embodiment, the stepped portion extends around the entire outer periphery of the substantially curtain-shaped portion.

In another embodiment, the stepped portion forms part of a groove formed in the substantially curtain-shaped portion.

In another aspect of the invention, the groove is locate remotely from the distal end.

In another aspect of the invention, the groove extends from a position remote from the distal end to the first principal surface portion.

In another aspect of the invention, the groove is spaced from both the distal end and the first principal surface portion.

In yet another aspect of the invention, the groove abuts the first principal surface portion.

In one embodiment of the invention, the piezoelectric resonator is provided on the first principal surface.

In another embodiment of the invention the piezoelectric resonator is provided on the first principal surface.

In a preferred embodiment of the invention, the piezoelectric resonator is a quartz crystal resonator.

In another embodiment of the invention the piezoelectric resonator unit comprises:

a first enclosure portion that includes a first principal surface portion and a substantially curtain-shaped portion which cooperate to define a first recessed portion, the first principal surface portion having a first flat principal surface, the substantially curtain-shaped portion surrounding the first principal surface when viewed from a normal direction to the first principal surface, the first principal surface of the first principal surface portion having a groove adjacent the substantially curtain-shaped portion;

a second enclosure portion that has a flat second principal surface and cooperating with the first recessed portion to define an enclosure;

a brazing material that joins a distal end of the first enclosure portion to the second enclosure portion to hermetically seal the enclosure; and a piezoelectric resonator that is accommodated in the recessed portion.

In one aspect of the invention, the groove is formed along the entire inner periphery of the substantially curtain-shaped portion.

In another aspect of the invention the groove and the piezoelectric resonator do not overlap each other when viewed from the normal direction to the first principal surface.

In another aspect of the invention the piezoelectric resonator is provided on the first principal surface.

In yet another aspect of the invention the piezoelectric resonator is provided on the second principal surface.

In another aspect of the invention the piezoelectric resonator is a quartz crystal resonator.

Other features, elements, characteristics and advantages of the present invention will become more apparent from the following detailed description of preferred embodiments of the present invention with reference to the attached drawings.

DESCRIPTION OF THE PREFERRED EMBODIMENTS

Structure of Quartz Crystal Unit

Figure 1:
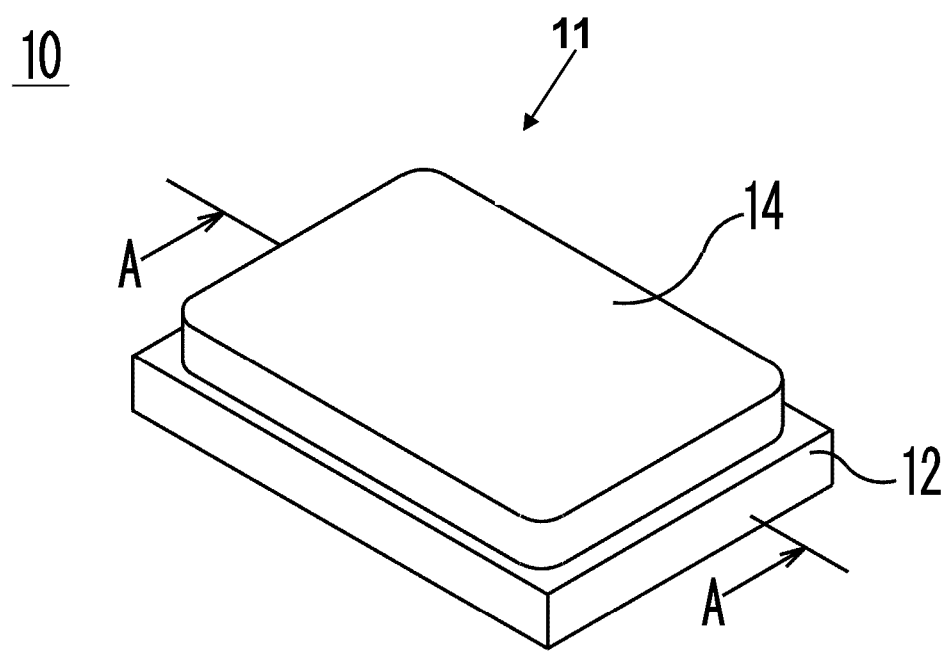
FIG. 1 is an external perspective view of a quartz crystal resonator unit.
Figure 1:
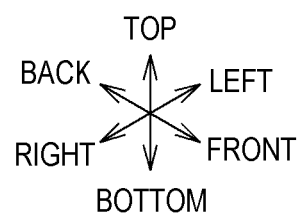
Figure 2:
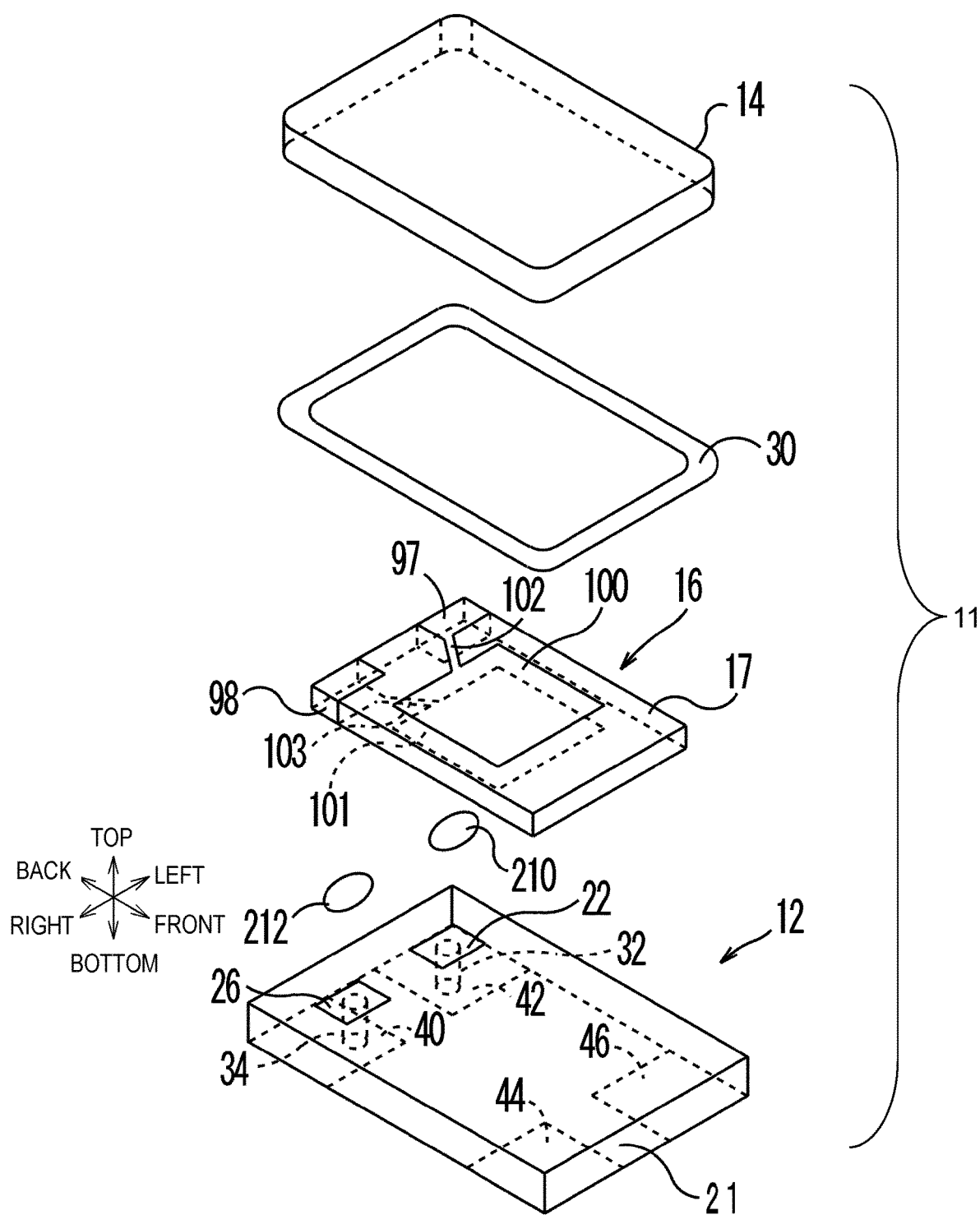
FIG. 2 is an exploded perspective view of the quartz crystal resonator unit of FIG. 1.
Figure 3:
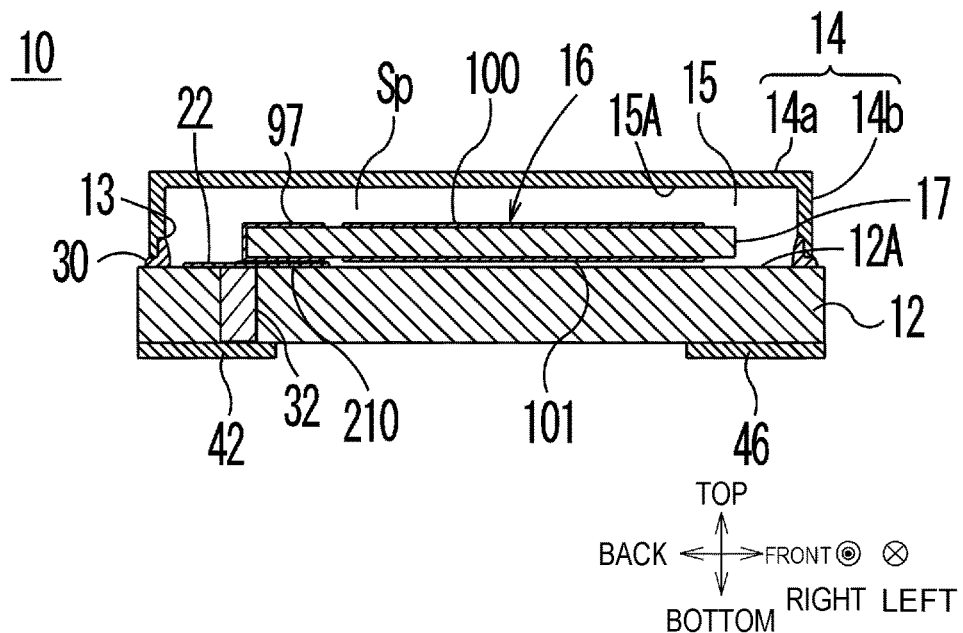
FIG. 3 shows a cross-section structure along A-A of FIG. 1.

A quartz crystal resonator unit according to an embodiment of the present invention is described below with reference to the drawings. FIG. 1 is an external perspective view of a quartz crystal resonator unit 10. FIG. 2 is an exploded perspective view of the quartz crystal resonator unit 10. FIG. 3 shows a cross-section structure along A-A of FIG. 1.

In the description below, a normal direction to a principal surface of the quartz crystal resonator unit 10 is defined as an up-down direction, and, when viewed from a top side, a direction in which a long side of the quartz crystal resonator unit 10 extends is defined as a front-back direction and a direction in which a short side of the quartz crystal resonator unit 10 extends is defined as a left-right direction.

As shown in FIGS. 1 to 3, the quartz crystal resonator unit 10 includes an enclosure 11 housing a quartz crystal resonator 16, and is an example of a piezoelectric resonator unit. The enclosure 11 is preferably a hermetically sealed container having a substantially rectangular parallelepiped structure and as best shown in FIG. 2, includes a substrate 12 (an example of a second enclosure portion), a cover 14 (an example of a first enclosure portion), and a brazing material 30. As best shown in FIG. 3, the enclosure 11 has an internal space Sp that is hermetically sealed from the outside thereof. That is, the enclosure 11 has an air-tight and fluid-tight structure. Therefore, it is possible to prevent the passage of gas, such as water vapor, and liquid, such as water, into the space Sp.

As best shown in FIG. 2, the substrate 12 includes a substrate body 21, outer electrodes 22, 26, 40, 42, 44, and 46, and via conductors 32 and 34. The substrate body 21 has a substantially plate-shaped structure, and, when viewed from the top side, has a substantially rectangular shape. Therefore, the substrate body 21 has a substantially rectangular upper surface and a substantially rectangular lower surface. The term "substantially rectangular shape" also encompasses a substantially square shape. The term "substantially rectangular shape" also encompasses, in addition to a rectangular shape, shapes that are slightly modified from the rectangular shape. The substrate body 21 is preferably formed from, for example, ceramics-based insulating materials, such as an aluminum oxide sintered body, a mullite sintered body, an aluminum nitride sintered body, a silicon carbide sintered body, or a glass ceramics sintered body; quartz crystals; glass; or silicon. In the one embodiment, the substrate body 21 is formed from an aluminum oxide sintered body.

The outer electrode 22 is preferably a substantially rectangular conductor layer that is provided near a back left corner of the upper surface of the substrate body 21. The outer electrode 26 is preferably a substantially rectangular conductor layer that is provided near a back right corner of the upper surface of the substrate body 21. The outer electrode 22 and the outer electrode 26 are disposed side by side in the left-right direction.

The outer electrode 40 is preferably a substantially square conductor layer that is provided near a back right corner of the lower surface of the substrate body 21. The outer electrode 42 is preferably a substantially square conductor layer that is provided near a back left corner of the lower surface of the substrate body 21. The outer electrode 44 is preferably a substantially square conductor layer that is provided near a front right corner of the lower surface of the substrate body 21. The outer electrode 46 is preferably a substantially square conductor layer that is provided near a front left corner of the lower surface of the substrate body 21.

The outer electrodes 22, 26, 40, 42, 44, and 46 each have a three-layer structure. More specifically, the outer electrodes 22, 26, 40, 42, 44, and 46 each include, from a lower layer side to an upper layer side, a molybdenum layer, a nickel layer, and a gold layer, which are laminated to each other.

The via conductors 32 and 34 extend through the substrate body 21 in a thickness direction (up-down direction) thereof. The via conductor 32 connects the outer electrode 22 and the outer electrode 42 to each other. The via conductor 34 connects the outer electrode 26 and the outer electrode 40 to each other. Each of the via conductors 32 and 34 is formed from a conductive material such as molybdenum.

The cover 14 is substantially a rectangular parallelepiped housing having an open lower side and is also called a metal cap. As best shown in FIG. 3, the cover 14 includes a flat plate portion 14a (an example of a first principal surface portion) and a substantially curtain-shaped portion 14b (it is curtain shaped in the sense that it extends downwardly from the flat plate portion 14b and defines the lateral edges of the recessed portion 15 described further below). The substantially curtain-shaped portion 14b is integrated with the flat plate portion 14a and includes four substantially plate-shaped portions that extend in a substantially normal direction to a principal surface of the flat plate portion 14a. When a lower surface 15A (an example of a first principal surface) of the flat plate portion 14a is viewed from a normal direction (downward), the substantially curtain-shaped portion 14b has a substantially rectangular curtain-shaped structure that surrounds the lower surface 15A. Therefore, the cover 14 has a substantially rectangular parallelepiped opening. The flat plate portion 14a and the substantially curtain-shaped portion 14b form a recessed portion 15 in the cover 14. The lower surface 15A is sometimes referred to herein as the bottom surface of the recessed portion 15.

Figure 4:
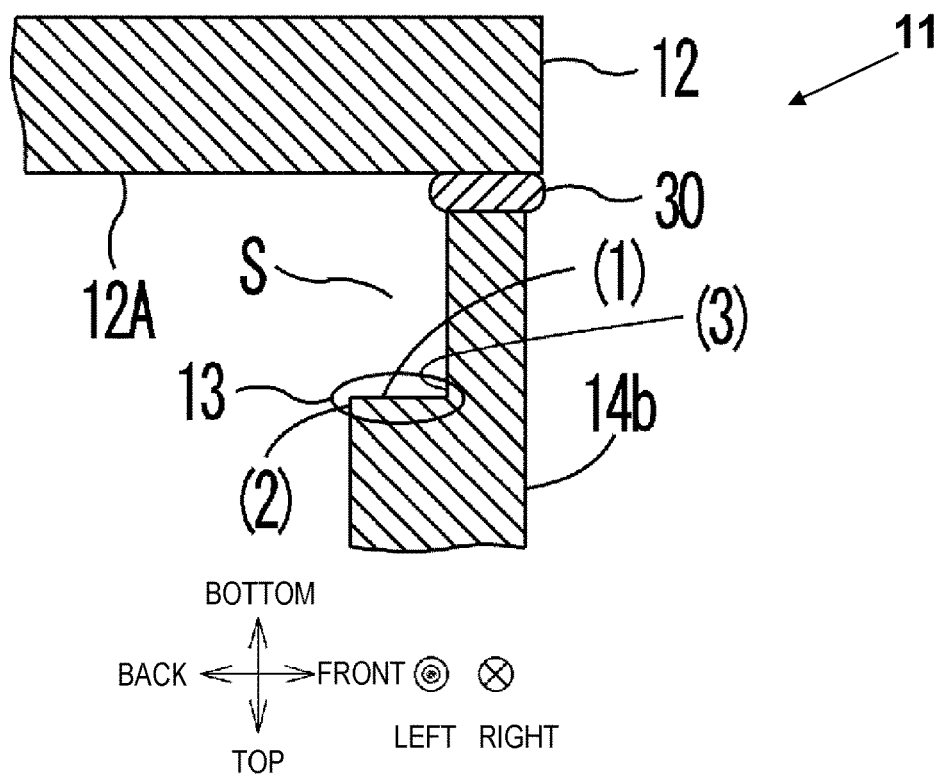
FIG. 4 shows a cross-section structure and a state of a substrate, a cover, and a brazing material when sealing an enclosure.

As best shown in FIG. 4, the thickness of the substantially curtain-shaped portion 14b varies in the normal direction to the lower surface 15A, that is, along the up-down (bottom-top) direction. More particularly, the substantially curtain-shaped portion 14b includes a thick-walled portion (the lower portion as viewed in FIG. 4) and a thin-walled portion (this upper portion as viewed in FIG. 4). This causes a stepped portion 13 to be formed at an inner peripheral surface of the substantially curtain-shaped portion 14b. As shown in FIG. 4, the stepped portion 13 includes the inner peripheral surface and the following portions described in (1) to (3) below at the inner peripheral surface of the substantially curtain-shaped portion 14b:

(1) a surface that connects a surface of the thick-walled portion and a surface of the thin-walled portion to each other (sometimes referred to as "connection surface" below), (2) a portion near the connection surface at the surface of the thick-walled portion, and (3) a portion near the connection surface at the surface of the thin-walled portion.

A region of the substantially curtain-shaped portion 14b that is adjacent to an end surface (lower end surface) thereof is thinner than other regions thereof. That is, a portion of the substantially curtain-shaped portion 14b that is situated above the stepped portion 13 (as viewed in FIG. 3) is thicker than a portion thereof that is situated below the stepped portion 13. Although, it is desirable that the stepped portion 13 be provided over the entire periphery of the substantially curtain-shaped portion 14b, this is not necessary. The stepped portion 13 can be provided at less than all parts of the substantially curtain-shaped portion 14b in a peripheral direction.

The cover 14 preferably includes a base material and a plating layer that is provided on a surface of the base material. The base material contains, for example, an iron-nickel alloy (for example, an alloy containing 42 mass % of nickel) or an iron-nickel-cobalt alloy (Kovar). The plating layer has a two-layer structure including a nickel layer that serves as a foundation and a gold layer that is provided on the nickel layer. The thickness of the nickel layer is that required to protect the base material against corrosion, and is, for example, about 2 $f$m. The thickness of the gold layer is, for example, about 0.01 μm. When the gold layer is too thin, adhesion with the brazing material 30 becomes poor, whereas when the gold layer is too thick, the cost becomes unnecessarily high.

In the embodiment, the cover 14 is preferably formed by plating a surface of the base material containing an iron-nickel alloy with nickel and gold. Therefore, the surface of the substantially curtain-shaped portion 14b including the stepped portion 13 is formed of a single material. Consequently, the stepped portion 13 differs from the stepped portion that is disclosed in Patent Document 3 above and that is formed by mounting on an inner surface of the cover a member formed of a material differing from that of the cover.

The brazing material 30 has a substantially rectangular-shaped structure, and, when viewed from a top side, surrounds the quartz crystal resonator 16 and the outer electrodes 22 and 26. The brazing material is a metal material having a melting point that is lower than those of the first enclosure portion and the second enclosure portion. Therefore, a resin material is not contained in the brazing material. The brazing material preferably includes hard solder having a melting point of about 450° C. or greater and soft solder having a melting point that is less than about 450° C. Soft solder is an alloy, such as a gold-tin alloy or a tin-lead alloy.

The brazing material 30 has the role of joining the substrate 12 and the cover 14 to each other. With an opening edge portion of the cover 14 superimposed upon an opening edge portion of the substrate 12 with the brazing material 30 interposed therebetween, the brazing material 30 is solidified after being alloyed with the edge portion of the substrate 12 and the opening edge portion of the cover 14. By this, the entire periphery of the opening edge portion (bottom portion) of the cover 14 is joined to an upper surface (an example of a second principal surface) 12A of the substrate 12. In this way, the recessed portion 15 is hermetically sealed by the upper surface 12A of the substrate 12. As a result, the upper surface 12A of the substrate body 21 and the cover 14 form the space Sp.

The quartz crystal resonator 16 is preferably accommodated in the enclosure 11 such that the quartz crystal resonator 16 can be electrically excited. The quartz crystal resonator 16 includes a quartz crystal blank 17, outer electrodes 97 and 98, excitation electrodes 100 and 101, and extended conductors 102 and 103. The quartz crystal resonator 16 is an example of a piezoelectric resonator. The quartz crystal blank 17 preferably has a substantially plate-shaped structure including upper and lower surfaces, and, when viewed from a top side, the quartz crystal blank 17 has a substantially rectangular shape. In place of the quartz crystal resonator 16, a piezoelectric ceramic resonator may be used as the piezoelectric resonator. In this case, in place of the quartz crystal blank 17, a piezoelectric ceramic blank may be used as a piezoelectric blank.

The quartz crystal blank 17 is a quartz crystal having a predetermined crystallographic axis. The quartz crystal blank 17 is, for example, an AT-cut quartz crystal blank formed by cutting a synthetic quartz crystal at a predetermined angle. The dimensions of the quartz crystal blank 17 is such that its length in the front-back direction is within a range of about 2.0 mm and its width in the left-right direction is within a range of about 1.6 mm. Considering, for example, the wall thickness of the enclosure 11, the spreading of a sealing material, and the precision with which the element is mounted, the quartz crystal blank 17 is designed such that its length in the front-back direction is about 1.500 mm or less and its width in the left-right direction is about 1.00 mm or less.

The outer electrode 97 is preferably a conductor layer that is provided at and near a back left corner of the quartz crystal blank 17. The outer electrode 97 is preferably formed at the upper surface, the lower surface, a back surface, and a left surface. The outer electrode 98 is preferably a conductor layer that is provided at and near a back right corner of the quartz crystal blank 17. The outer electrode 98 is preferably formed at the upper surface, the lower surface, the back surface, and a right surface. The outer electrodes 97 and 98 are preferably arranged side by side along a short side of the quartz crystal blank 17.

The excitation electrode 100 is preferably provided at the center of the upper surface of the quartz crystal blank 17, and, when viewed from a top side, has a substantially rectangular shape. The excitation electrode 101 is preferably provided at the center of the lower surface of the quartz crystal blank 17, and, when viewed from a top side, has a substantially rectangular shape. Outer edges of the excitation electrode 100 and outer edges of the excitation electrode 101 overlap each other when viewed from the top side.

The extended conductor 102 is provided at the upper surface of the quartz crystal blank 17, and connects the outer electrode 97 and the excitation electrode 100 to each other. The extended conductor 103 is provided at the lower surface of the quartz crystal blank 17, and connects the outer electrode 98 and the excitation electrode 101 to each other. The outer electrodes 97 and 98, the excitation electrodes 100 and 101, and the extended conductors 102 and 103 each have a two-layer structure, and includes a chromium layer and a gold layer. The chromium layer is provided on a surface of the quartz crystal blank 17. The gold layer is a surface metal layer that is provided on the chromium layer. The gold layer has low adhesion with respect to the quartz crystal blank 17. Therefore, by being provided between the gold layer and the quartz crystal blank, the chromium layer functions as an adhesion layer of each of the outer electrodes 97 and 98, the excitation electrodes 100 and 101, and the extended conductors 102 and 103 with respect to the surface of the quartz crystal blank 17. In place of the chromium layer, other metal layers, such as a titanium layer, may be used as the adhesion layer.

The quartz crystal resonator 16 is mounted on the upper surface 12A of the substrate 12. More specifically, the outer electrode 22 and the outer electrode 97 are fixed to each other in an electrically connected state by a conductive adhesive member 210 and the outer electrode 26 and the outer electrode 98 are fixed to each other in an electrically connected state by a conductive adhesive member 212. As a result, the quartz crystal resonator 16 is supported by the substrate 12 by using the conductive adhesive members 210 and 212. The materials of the conductive adhesive members 210 and 212 are, for example, those that contain conductive material fillers, such as silver fillers, in an epoxy-resin base material.

Method of Manufacturing a Quartz Crystal Unit

One possible method of manufacturing the quartz crystal resonator unit 10 is described below with reference to the drawings.

First, the substrate 12 is manufactured. A mother board including a plurality of substrate bodies 21 arranged in a matrix is prepared. The mother board is formed of the same material as the substrate bodies 21. Examples of the material include ceramics-based insulating materials, such as an aluminum oxide sintered body, a mullite sintered body, an aluminum nitride sintered body, a silicon carbide sintered body, and a glass ceramics sintered body; quartz crystals; glass; and silicon.

Next, locations on the mother board where the via conductors 32 and 34 are to be disposed are irradiated with a beam to form substantially circular through holes (via holes) therein. The via conductors 32 and 34 are embedded in the via holes.

Next, base electrodes of the outer electrodes 40, 42, 44, and 46 are formed on a lower surface of the mother board. More specifically, a molybdenum layer is applied to the lower surface of the mother board, and is dried. Thereafter, the molybdenum layer is sintered. By this, the base electrodes of the outer electrodes 40, 42, 44, and 46 are formed.

Next, base electrodes of the outer electrodes 22 and 26 are formed on an upper surface of the mother board. More specifically, a molybdenum layer is applied to the upper surface of the mother board, and is dried. Thereafter, the molybdenum layer is sintered. By this, the base electrodes of the outer electrodes 22 and 26 are formed.

Next, the base electrodes of the outer electrodes 40, 42, 44, 46, 22, and 26 are each plated with nickel and gold in that order. By this, the outer electrodes 40, 42, 44, 46, 22, and 26 are formed.

Next, using a dicing blade, the mother board is divided into a plurality of substrate bodies 21. It is possible to, after forming dividing grooves in the mother board by irradiating the mother board with a laser beam, divide the mother board into the plurality of substrate bodies 21. By this, the substrate 12 is completed.

Next, the quartz crystal resonator 16 is manufactured (or obtained). A quartz crystal ore is subjected to AT cutting to obtain the substantially rectangular plate-shaped quartz crystal blank 17. Further, if necessary, using a barrel finishing device, bevel processing is performed on the quartz crystal blank 17. By this, portions of the quartz crystal blank 17 near edge lines are cut to obtain the quartz crystal blank 17 having a beveled shape.

Next, the outer electrodes 97 and 98, the excitation electrodes 100 and 101, and the extended conductors 102 and 103 are formed at the surfaces of the quartz crystal blank 17. Since the steps of forming the outer electrodes 97 and 98, the excitation electrodes 100 and 101, and the extended conductors 102 and 103 are general steps, they are not described. By this, the quartz crystal resonator 16 is completed.

Next, the quartz crystal resonator 16 is mounted on the upper surface 12A of the substrate 12. More specifically, as shown in FIGS. 2 and 3, the outer electrode 22 and the outer electrode 97 are adhered to each other by the conductive adhesive member 210, and the outer electrode 26 and the outer electrode 98 are adhered to each other by the conductive adhesive member 212.

Next, the enclosure 11 is hermetically sealed. Here, the cover 14 is oriented such that an opening thereof faces upward (towards a side opposite to the direction in which gravitational force acts). In this state, the brazing material 30 is placed on an end surface of the substantially curtain-shaped portion 14b of the cover 14. The brazing material 30 may be fused with the end surface of the substantially curtain-shaped portion 14b. It is possible to apply a conductive paste that contains metal powder on the end surface of the substantially curtain-shaped portion 14b and bake the conductive paste, to form the brazing material 30. Alternatively, solder may be used as the brazing material 30.

The substrate 12 is placed on the cover 14 with the upper surface (the surface on which the quartz crystal resonator 16 has been mounted) 12A faced downward, that is, in the direction in which gravitational force acts such that the opening of the cover 14 covered. FIG. 4 shows this state. By this, the brazing material 30 is interposed between the end surface of the substantially curtain-shaped portion 14b and the upper surface 12A of the substrate 12. In this state, the brazing material 30 is heated along with the cover 14 and the substrate 12 to alloy the brazing material 30. When the brazing material 30 is a gold-tin alloy, the heating temperature is, for example, about 290° C. or greater and about 320° C. or less. Thereafter, by a cooling operation, the brazing material 30, at least a part of which has been alloyed, is solidified. As a result, the enclosure 11 is hermetically sealed. When the above-described steps have been performed, the quartz crystal resonator unit 10 is completed.

Effects

As described below, the quartz crystal resonator unit 10 according to the embodiment is capable of effectively suppressing the spreading out of the brazing material 30 in a direction inward of the curtain-shaped portion 14b.

When hermetically sealing the enclosure 11 by the brazing material 30, the brazing material 30 may protrude from a location between the inner end surface of the substantially curtain-shaped portion 14b and the upper surface 12A (the lower surface when hermetically sealing the enclosure 11 as viewed in FIG. 4) of the substrate 12. With reference to FIG. 4, the brazing material 30 protruding inwardly from a location between the end surface of the substantially curtain-shaped portion 14b and the upper surface 12A of the substrate 12 spreads out in a space S (called an accommodation space below) above the stepped portion 13 of the substantially curtain-shaped portion 14b. However, the brazing material 30 is captured by the stepped portion 13. At this time, since the direction in which the spreading out progresses (i.e., downwardly as viewed in FIG. 4) is the same as the direction in which gravitational force acts, the brazing material 30 is easily kept back by the accommodation space S. That is, the brazing material is maintained in the area of the curtain-shaped portion 14b and does not flow inwardly to contact other components located in the recessed portion 15.

When the accommodation space S is provided, the quartz crystal resonator unit 10 allows the spreading-out area of the brazing material 30 to be reduced. Therefore, it is easy to prevent a case in which the brazing material 30 reaches the quartz crystal resonator 16 and is solidified and a case in which the brazing material 30 reaches the conductive adhesive members 210 and 212 and the outer electrodes 22, 26, 97, and 98 and is solidified. When the brazing material 30 reaches the quartz crystal resonator 16 and is solidified, the quartz crystal resonator 16 is prevented from vibrating. When the brazing material 30 reaches the conductive adhesive members 210 and 212 and the outer electrodes 22, 26, 97, and 98 and is solidified, an electrical short circuit may occur. However, by implementing the embodiment of the present invention, it is possible to obtain the quartz crystal resonator unit 10 in which these cases are prevented.

If the amount of the protruding brazing material 30 from a location between the end surface of the substantially curtain-shaped portion 14b and the upper surface 12A of the substrate 12, which is a joint portion, is increased, a gap may be formed in the joint portion and the air-tightness may be reduced. In the above-described embodiment, the stepped portion 13 is provided near the joint portion and when the brazing material 30 spreads out it is captured at a location near the joint portion, so that it is possible to reduce the amount of brazing material 30 that protrudes from a location between the end surface of the substantially curtain-shaped portion 14b and the upper surface 12A of the substrate 12. As a result, it is possible to reduce the size of the gap in the joint portion and increase the air-tightness.

At the substantially curtain-shaped portion 14b, by either increasing the difference between the thickness of the thick-walled portion and the thickness of the thin-walled portion or widening a region where the thin-walled portion is formed, it is possible to increase the volume of the accommodation space S. This allows the volume of the accommodation space S to provide sufficient capacity to accommodate the brazing material 30 that spreads out.

When a groove is provided in the cover as described in Patent Document 1, if the width of the groove is increased for increasing the volume of the groove, as viewed from the up-down direction, a region where the groove is formed and a region that is occupied by the piezoelectric resonator overlap each other. In this case, when the brazing material spreads out by a degree that fills the groove, the brazing material may contact the piezoelectric resonator. In contrast, in the quartz crystal resonator unit 10, even if the distance between an upper end and a lower end of the accommodation space S is made large to increase the volume of the accommodation space S, the region where the accommodation space S is formed and the location of the quartz crystal resonator 16 do not overlap when viewed from the up-down direction. Therefore, in the quartz crystal resonator unit 10, the brazing material that has spread does not easily contact the quartz crystal resonator 16.

During alloying, when the temperature has become high and the brazing material 30 whose fluidity has become high contacts the cover 14, the temperature of the plating layer (the nickel layer and the gold layer) of the cover 14 becomes high. At this time, gas that has been introduced into the plating layer is discharged. By reducing the spreading-out area of the brazing material 30, it is possible to reduce the amount of discharge of such gas (outgas).

Modifications

Figure 5:
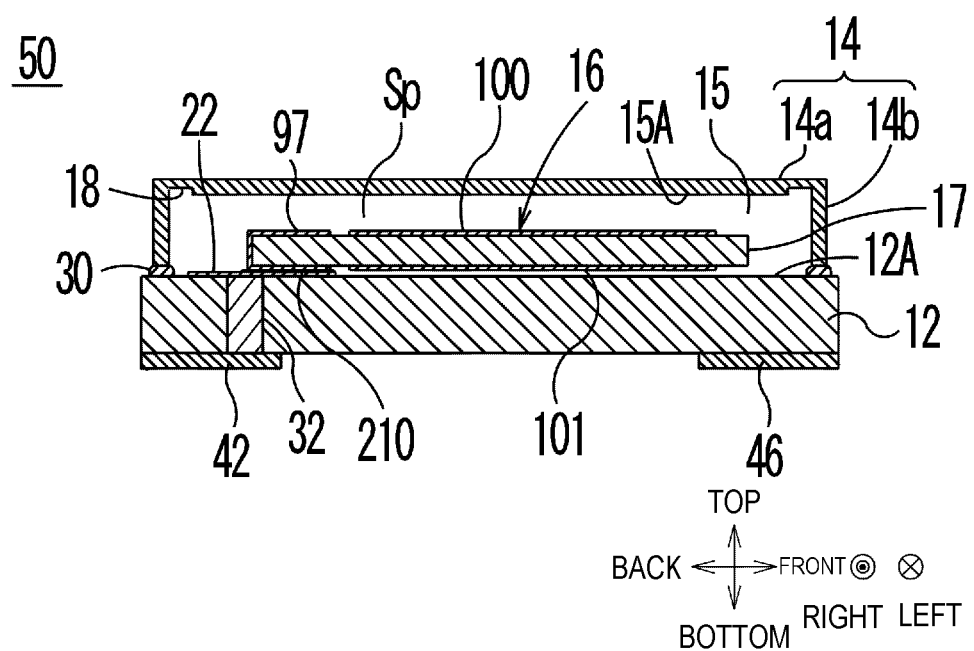
FIG. 5 shows a cross-section structure of another quartz crystal resonator unit.

FIG. 5 shows a cross-section structure of a quartz crystal resonator unit 50 according to another embodiment of the present invention. In FIG. 5, components and portions that are similar to the components and portions that are shown in FIGS. 1 to 4 are given the same reference numerals, and the descriptions thereof are not repeated. The quartz crystal resonator unit 50 does not include the stepped portion 13 of the quartz crystal resonator unit 10. A substantially curtain-shaped portion 14b has a substantially constant thickness. In the quartz crystal resonator unit 50, a lower surface 15A of a flat plate portion 14a has a groove 18 along the substantially curtain-shaped portion 14b. Although it is desirable that the groove 18 be provided along the entire periphery of the substantially curtain-shaped portion 14b, that is not necessary. In this embodiment, the groove 18 is adjacent to the substantially curtain-shaped portion 14b. As viewed from a normal direction to the lower surface 15A, the groove 18 and a quartz crystal resonator 16 do not overlap each other.

When manufacturing the quartz crystal resonator unit 50, a cover 14 is oriented such that an opening thereof faces upward (towards a side opposite to the direction in which gravitational force acts), and, similarly to the quartz crystal resonator unit 10, an enclosure 11 is hermetically sealed. At this time, the groove 18 is positioned below a brazing material 30. Therefore, when the brazing material 30 protrudes from a location between an end surface of the substantially curtain-shaped portion 14b and a substrate 12, the brazing material 30 that has spread out spreads out into the groove 18 by flowing on an inner peripheral surface of the substantially curtain-shaped portion 14b.

In the quartz crystal resonator unit 50, if the distance between the groove 18 and the brazing material 30 in a state prior to the spreading out of the brazing material 30 is large, the distance by which the brazing material 30 protruding from a location between the end surface of the substantially curtain-shaped portion 14b and the substrate 12 flows on the inner peripheral surface of the substantially curtain-shaped portion 14b is increased, so that the amount of brazing material that spreads out to the inside of the groove 18 is reduced. Since, as viewed from the normal direction to the lower surface 15A, the groove 18 and the quartz crystal resonator 16 do not overlap each other, even if the brazing material 30 spreads out to the groove 18, the brazing material 30 does not easily contact the quartz crystal resonator unit 50. Therefore, in the quartz crystal resonator unit 50, even if the brazing material 30 protrudes from the location between the end surface of the substantially curtain-shaped portion 14b and the substrate 12 and spreads out, a case in which the brazing material 30 contacts the quartz crystal resonator 16 and a case in which an electrical short circuit occurs are easily prevented.

The groove 18 may be provided at a location spaced from the substantially curtain-shaped portion 14b.

OTHER EMBODIMENTS

The piezoelectric resonator unit according to the present invention is not limited to the above-described quartz crystal resonator units 10 and 50, and is changeable within the spirit thereof.

For example, in the quartz crystal resonator unit 10, a region of the substantially curtain-shaped portion 14b, which becomes side walls of the cover 14, that is adjacent to a location where the brazing material 30 is provided on the end surface of the substantially curtain-shaped portion 14b is thinner than other regions of the substantially curtain-shaped portion 14b. However, a region that is provided at a location spaced from the location where the brazing material 30 is provided may be thinner than other regions of the substantially curtain-shaped portion 14b. That is, the thick-walled portion may be adjacent to the location where the brazing material 30 is provided and the thin-walled portion may be provided away from the location where the brazing material 30 is provided (the opposite of what is shown in FIG. 4). When the region of the substantially curtain-shaped portion 14b that is provided away from the location where the brazing material 30 is provided is thinner than the other regions, it is possible to increase the thickness of a portion of the substantially curtain-shaped portion 14b that faces the substrate 12. This makes it possible to increase the area of the joint between the substantially curtain-shaped portion 14b and the substrate 12.

Figure 6:
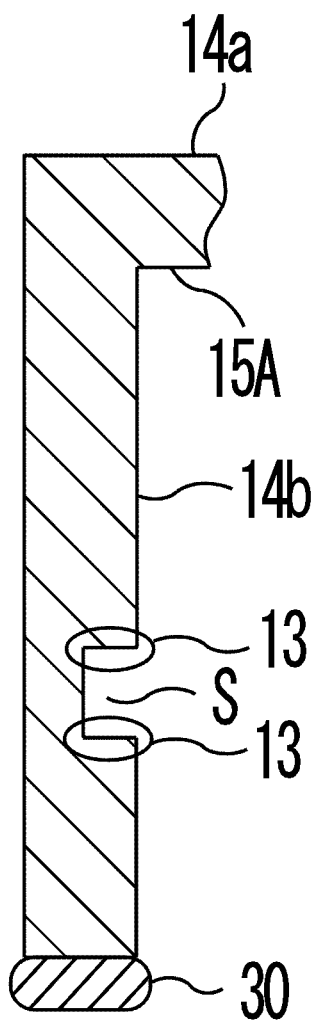
FIG. 6 shows a cross-section structure of the quartz crystal resonator unit in which a thin-walled portion of a substantially curtain-shaped portion is provided away from a brazing material.
Figure 6:
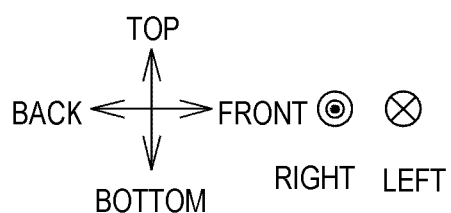
Figure 7:
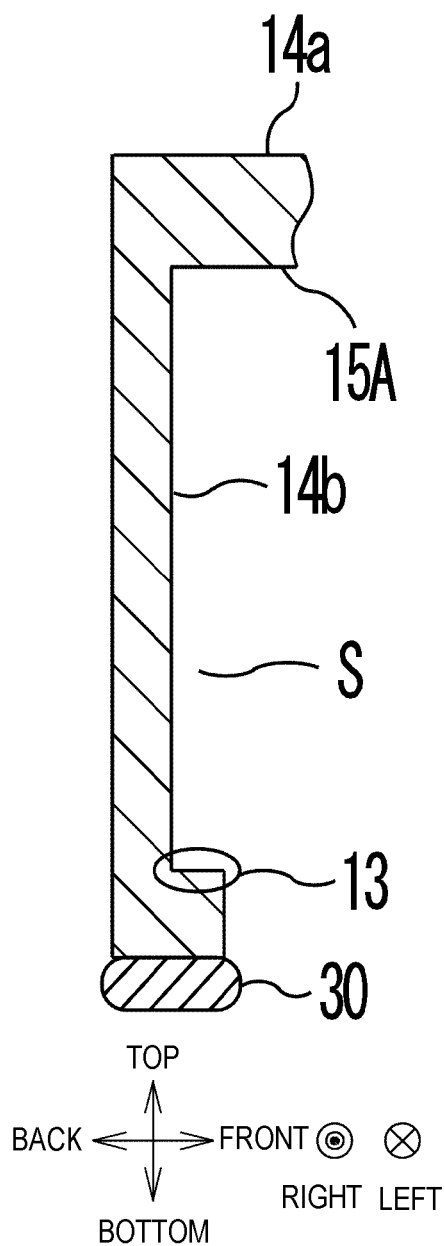
FIG. 7 shows a cross-section structure of the quartz crystal resonator unit in which a thin-walled portion of the substantially curtain-shaped portion is provided away from the brazing material.
Figure 8:
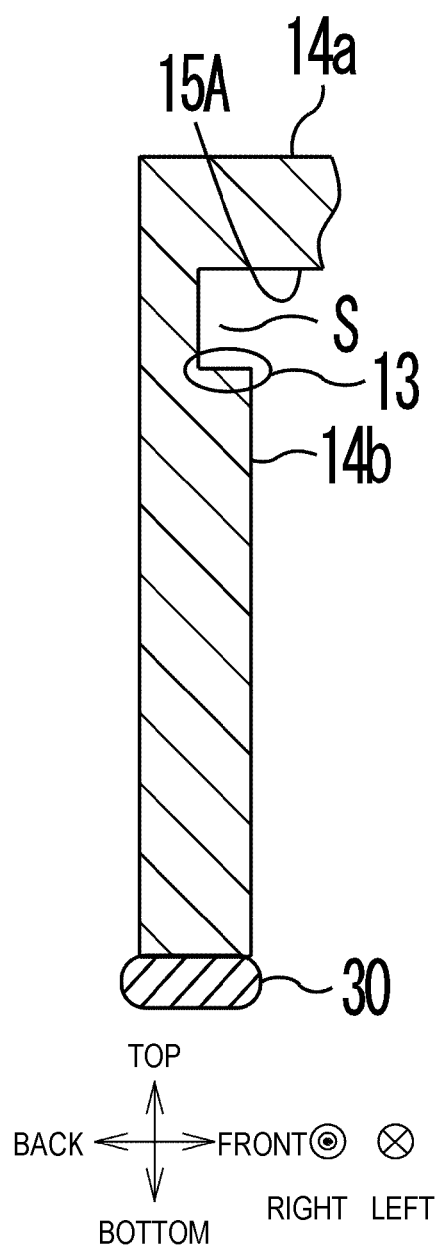
FIG. 8 shows a cross-section structure of the quartz crystal resonator unit in which a thin-walled portion of the substantially curtain-shaped portion is provided away from the brazing material.

As shown in FIG. 6, a thin-walled portion may be positioned away from both the location where the brazing material 30 is provided and the flat plate portion 14a. In this case, a stepped portion 13 is provided between the thin-walled portion and a thick-walled portion provided below the thin-walled portion, and a stepped portion 13 (in this case a recess) is provided between the thin-walled portion and a thick-walled portion provided above the thin-walled portion. As shown in FIGS. 7 and 8, a thin-walled portion may be positioned away from the location where the brazing material 30 is provided and adjacent to the flat plate portion 14a. As shown in FIG. 7, the thin-walled portion may be provided along at least about half of an inner wall of the substantially curtain-shaped portion 14b in the normal direction to the lower surface 15A of the flat plate portion 14a. As shown in FIG. 8, the thin-walled portion may be provided only at a portion of the substantially curtain-shaped portion 14b near the flat plate portion 14a in the normal direction to the lower surface 15A of the flat plate portion 14a. In either case, the stepped portion 13 having a surface (connection surface) extending in a substantially normal direction to the inner peripheral surface of the substantially curtain-shaped portion 14b is provided at the cover 14 at a location between the thin-walled portion and the thick-walled portion provided below the thin-walled portion.

The inner peripheral surface of the substantially curtain-shaped portion 14b has wettability with respect to the brazing material 30. Therefore, when hermetically sealing the enclosure 11, if the brazing material 30 protrudes from a location between the end surface of the substantially curtain-shaped portion 14b and the substrate 12, a part of the brazing material 30 spreads out onto the inner peripheral surface of the substantially curtain-shaped portion 14b, and the brazing material 30 spreads out into the accommodation space S (the space above or below the stepped portion 13). Even at the substantially curtain-shaped portion 14b in FIGS. 6 to 8, it is desirable that the stepped portion 13 be provided along the entire periphery of the substantially curtain-shaped portion 14b. However, the stepped portion 13 need not be provided along a part of the substantially curtain-shaped portion 14b in the peripheral direction.

The first enclosure portion and the second enclosure portion may be formed from a ceramic substrate having a recessed portion and a substantially flat-plate-shaped metal plate. In this case, the quartz crystal resonator, serving as a piezoelectric resonator, is provided on a bottom surface (an example of a first principal surface) of the recessed portion of the ceramic substrate.

The structures of the above-described embodiments may be arbitrarily combined. For example, one quartz crystal resonator unit may include both the stepped portion 13 and the groove 18.

As described above, the present invention has the effect of making it possible to suppress the spreading out of brazing material at the piezoelectric resonator unit.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A piezoelectric resonator unit comprising:
a first enclosure portion that includes a first principal surface portion and a substantially curtain-shaped portion which cooperate to define a recessed portion, the first principal surface portion having a first flat principal surface, the substantially curtain-shaped portion surrounding the first flat principal surface when viewed from a normal direction to the first flat principal surface;
a second enclosure portion that cooperates with the recessed portion to define an enclosure;
a brazing material that joins a distal end of the first enclosure portion to the second enclosure portion to hermetically seal the enclosure; and
a piezoelectric resonator that is accommodated in the enclosure;
wherein an inner peripheral surface of the substantially curtain-shaped portion includes a stepped portion including a thicker portion and a thinner portion as measured in a direction parallel to the first principal surface portion, the thinner portion being located at a position that is remote from the distal end of the substantially curtain-shaped portion, the thicker portion being located adjacent the distal end of the substantially curtain-shaped portion.

2. The piezoelectric resonator unit according to claim 1, wherein the stepped portion extends around an entire inner periphery of the substantially curtain-shaped portion as viewed from the normal direction to the first flat principal surface.

3. The piezoelectric resonator unit according to claim 1, wherein the stepped portion forms part of an enclosed groove formed entirely in the substantially curtain-shaped portion.

4. The piezoelectric resonator unit according to claim 3, wherein the enclosed groove is locate remotely from the distal end.

5. The piezoelectric resonator unit according to claim 1, wherein the thinner portion of the stepped portion extends from the position remote from the distal end of the substantially curtain-shaped portion to the first principal surface portion.

6. The piezoelectric resonator unit according to claim 4, wherein the enclosed groove is spaced from both the distal end and the first principal surface portion.

7. The piezoelectric resonator unit according to claim 1, wherein the piezoelectric resonator is a quartz crystal resonator.

8. The piezoelectric resonator unit according to claim 1, wherein the second enclosure portion has a second flat principal surface.

9. The piezoelectric resonator unit according to claim 8, wherein the piezoelectric resonator is provided on the second flat principal surface.

10. The piezoelectric resonator unit according to claim 1, wherein the second enclosure portion has a second flat principal surface and the distal end of the first enclosure portion is joined to the second flat principal surface by the brazing material.

* * * * *